(12) United States Patent
Yun et al.

(10) Patent No.: US 10,444,270 B2
(45) Date of Patent: Oct. 15, 2019

(54) SYSTEMS FOR TESTING SEMICONDUCTOR PACKAGES

(71) Applicant: Samsung Electronics Co., Ltd., Suwon-si (KR)

(72) Inventors: Ji Nyeong Yun, Yongin-si (KR); Jae Moo Choi, Suwon-si (KR); Jong Pill Park, Suwon-si (KR); Jae Hong Kim, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 123 days.

(21) Appl. No.: 15/455,818

(22) Filed: Mar. 10, 2017

(65) Prior Publication Data

US 2017/0261548 A1    Sep. 14, 2017

Related U.S. Application Data

(60) Provisional application No. 62/307,394, filed on Mar. 11, 2016.

(30) Foreign Application Priority Data

Jul. 21, 2016  (KR) ........................ 10-2016-0092482

(51) Int. Cl.
*G01R 31/01*  (2006.01)
*G01R 31/28*  (2006.01)
(Continued)

(52) U.S. Cl.
CPC .......... *G01R 31/01* (2013.01); *G01R 1/07364* (2013.01); *G01R 31/2893* (2013.01); *G01R 31/31907* (2013.01)

(58) Field of Classification Search
CPC .............. G01R 31/01; G01R 31/31907; G01R 31/2893; G01R 1/07364
See application file for complete search history.

(56) References Cited

U.S. PATENT DOCUMENTS 6,404,220 B1 *  6/2002  Hashimoto ...... G01R 31/31917
                                                324/73.1
6,774,662 B2   8/2004  Co et al.
(Continued)

FOREIGN PATENT DOCUMENTS

JP       2011-146081        7/2011
KR    1020080058343 A       6/2008
WO    WO 2007/035664        3/2007

*Primary Examiner* — Akm Zakaria
(74) *Attorney, Agent, or Firm* — Muir Patent Law, PLLC

(57) ABSTRACT

A semiconductor integrated circuit test system can include a first semiconductor integrated circuit tester configured to conduct a first test of a first characteristic of one of a plurality of semiconductor integrated circuits, wherein the first test is completed by the first semiconductor integrated circuit tester within a first test time. A second semiconductor integrated circuit tester, can be coupled to the first semiconductor integrated circuit tester, where the second semiconductor integrated circuit tester can be configured to conduct a second test of a second characteristic of each of the plurality of the semiconductor integrated circuits simultaneously, wherein the second test is completed within a second test time that is at least about two orders of magnitude more than the first test time.

9 Claims, 19 Drawing Sheets

(51) Int. Cl.
  *G01R 1/073* (2006.01)
  *G01R 31/319* (2006.01)

(56) References Cited

U.S. PATENT DOCUMENTS

| | | |
|---|---|---|
| 7,694,246 B2 | 4/2010 | Miller et al. |
| 7,733,106 B2 | 6/2010 | Dozier, II et al. |
| 8,513,969 B2 | 8/2013 | Dozier, II et al. |
| 8,648,615 B2 | 2/2014 | Rahman |
| 8,691,601 B2 | 4/2014 | Izuha |
| 8,707,238 B2 | 4/2014 | Chuang et al. |
| 9,116,203 B2 | 8/2015 | Wu et al. |
| 2005/0156616 A1* | 7/2005 | Morishita ........ G01R 31/31701 324/754.03 |
| 2007/0057684 A1* | 3/2007 | Chong ............... G01R 1/07342 324/754.07 |
| 2008/0018350 A1* | 1/2008 | Chao ................. G01R 1/07378 324/754.18 |
| 2008/0038098 A1* | 2/2008 | Ito .................... G01R 31/31718 414/222.01 |
| 2009/0192754 A1* | 7/2009 | Balog ................ G01R 31/2894 702/117 |
| 2011/0050273 A1 | 3/2011 | Ma |
| 2014/0361804 A1 | 12/2014 | Wang et al. |

* cited by examiner

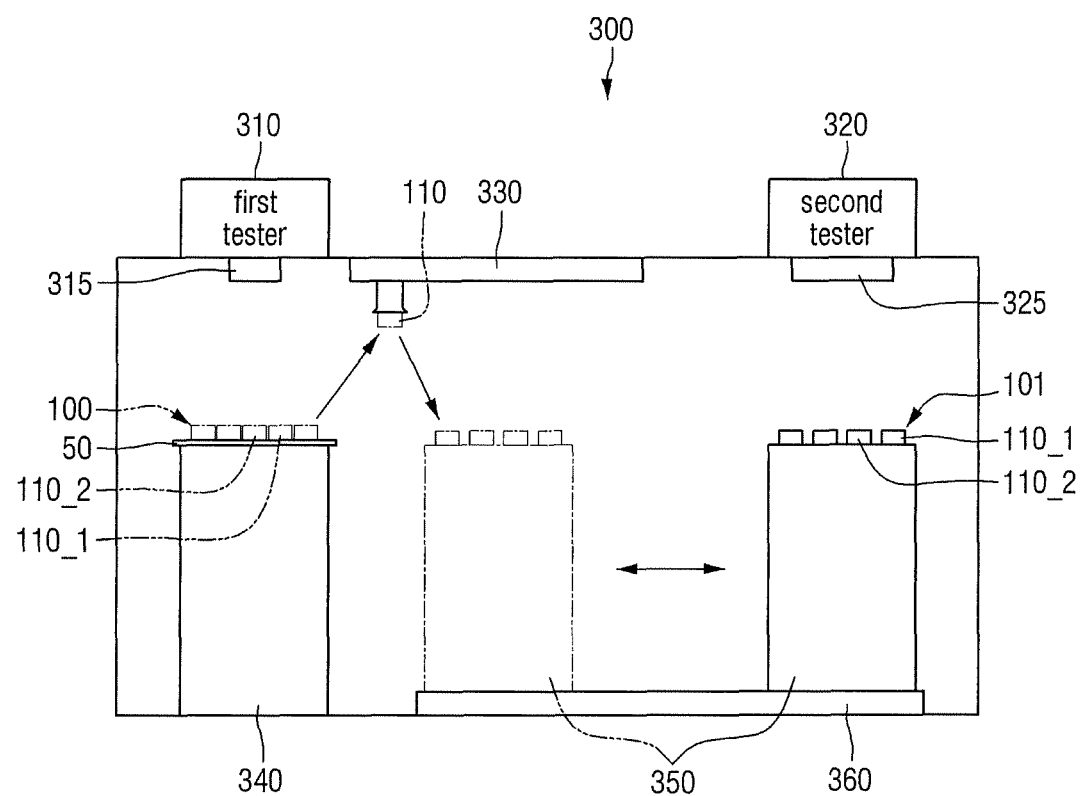

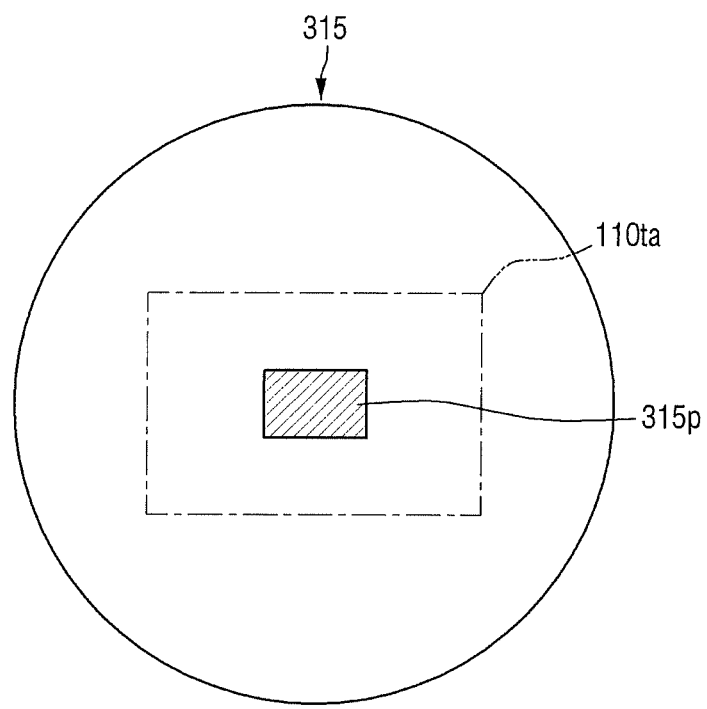

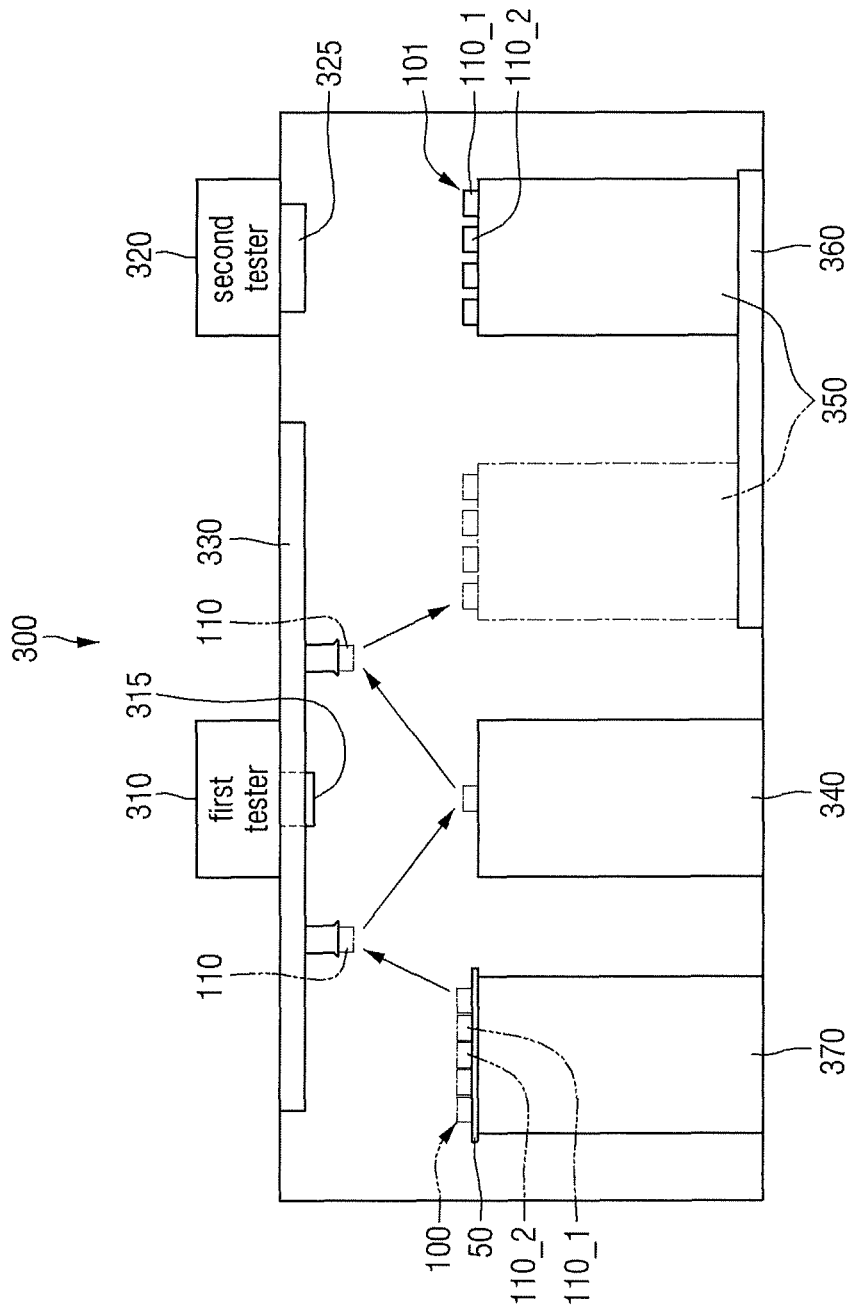

SYSTEMS FOR TESTING SEMICONDUCTOR PACKAGES

CROSS-REFERENCE TO RELATED APPLICATIONS

This application claims priority from U.S. Patent Application No. 62/307,394 filed on Mar. 11, 2016 and Korean Patent Application No. 10-2016-0092482 filed on Jul. 21, 2016 in the Korean Intellectual Property Office, the disclosures of which are incorporated herein by reference in their entireties.

FIELD

The present disclosure relates testing of semiconductor packages.

BACKGROUND

The current trends in the electronic industry are moving toward the fabrication of light-weight, small, fast, multi-functional, high-performance products at an economical price. Further, integrated circuits may be provided as a three-dimensional structure such as multi-chip stacked package to enhance the performance of the integrated circuit. For example, an integrated circuit having a three-dimensional structure in which a plurality of memory chips are stacked can include many signal buses for transmitting and receiving signals.

SUMMARY

A semiconductor integrated circuit test system can include a first semiconductor integrated circuit tester configured to conduct a first test of a first characteristic of one of a plurality of semiconductor integrated circuits, wherein the first test is completed by the first semiconductor integrated circuit tester within a first test time. A second semiconductor integrated circuit tester, can be coupled to the first semiconductor integrated circuit tester, where the second semiconductor integrated circuit tester can be configured to conduct a second test of a second characteristic of each of the plurality of the semiconductor integrated circuits simultaneously, wherein the second test is completed within a second test time that is at least about two orders of magnitude more than the first test time.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which:

FIG. 5 is a view provided to explain equipment used to test semiconductor packages used in a method for testing a semiconductor package according to some exemplary embodiments;

FIGS. 6A and 6B are views provided to explain a contactor module included in the semiconductor package test equipment of FIG. 5;

FIG. 7 is a view provided to explain semiconductor package test equipment used in a method of testing semiconductor packages according to some exemplary embodiments;

DETAILED DESCRIPTION OF EMBODIMENTS

Referring to FIGS. 1 to 6B, a method for testing a semiconductor package according to some exemplary embodiments will be explained below.

Figure 1:
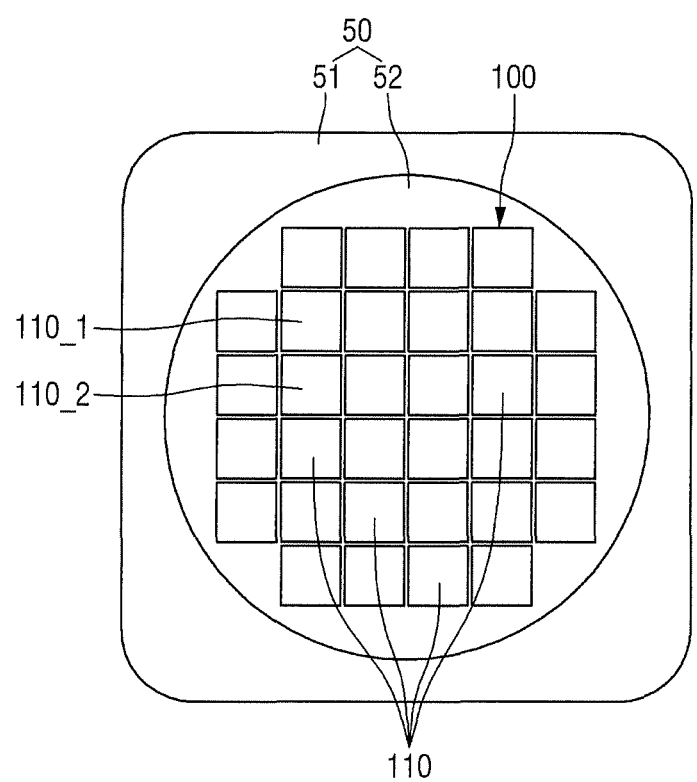
FIG. 1 is a view provided to explain semiconductor packages used in a method for testing a semiconductor package according to some exemplary embodiments.
Figure 2A:
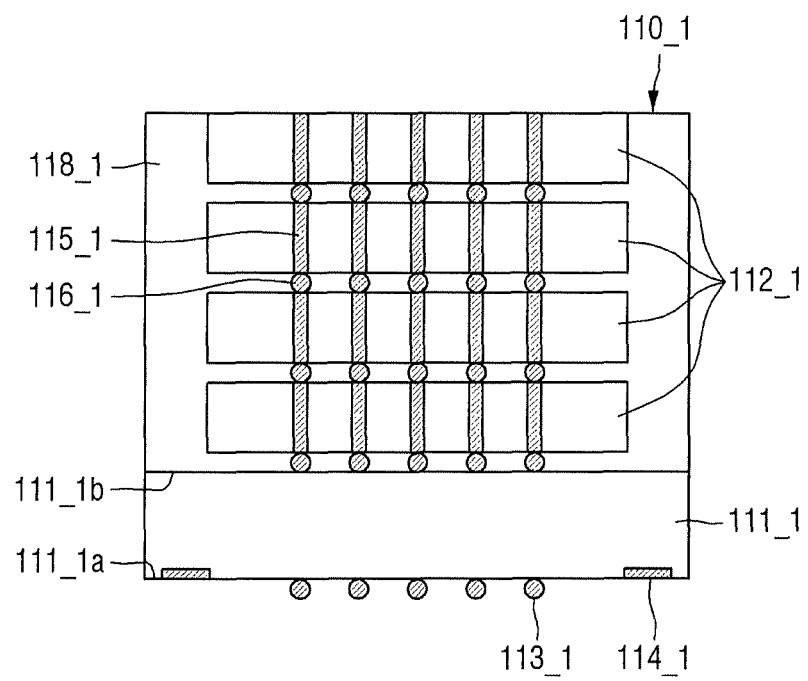
FIGS. 2A and 2B are cross sectional views provided to explain the semiconductor package of FIG. 1.
Figure 2B:
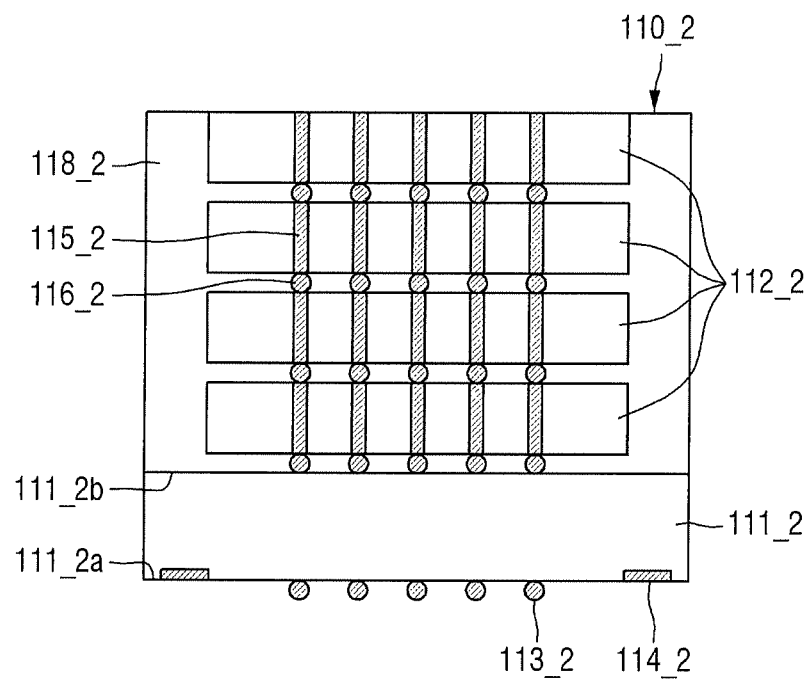
Figure 3A:
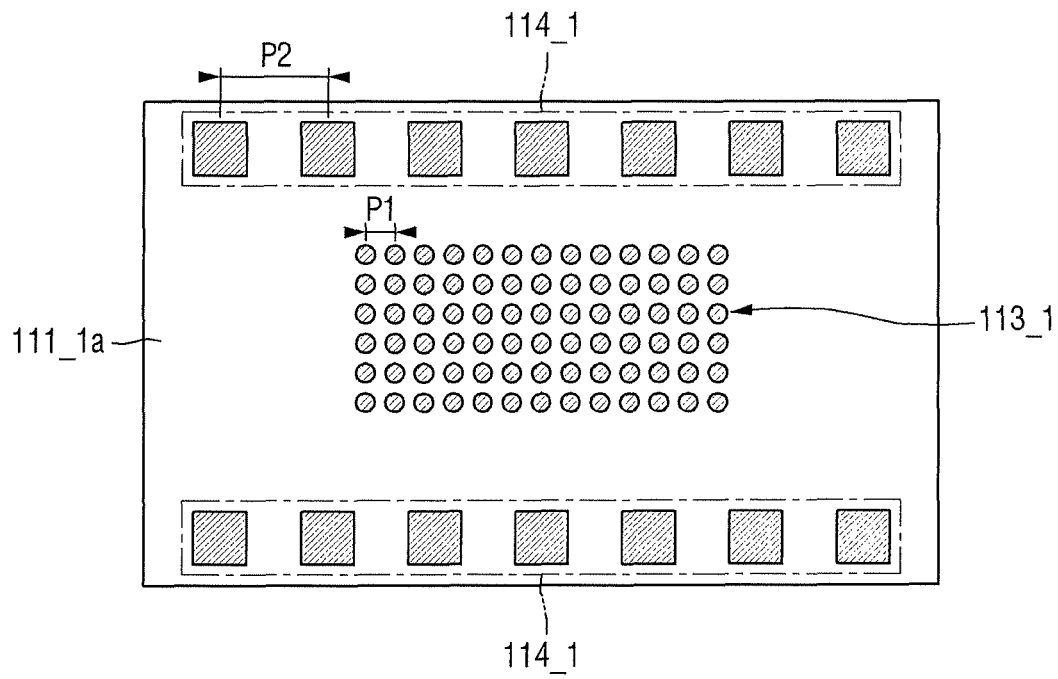
FIGS. 3A and 3B are views provided to explain an external terminal group of the semiconductor package of FIG. 1.
Figure 3B:
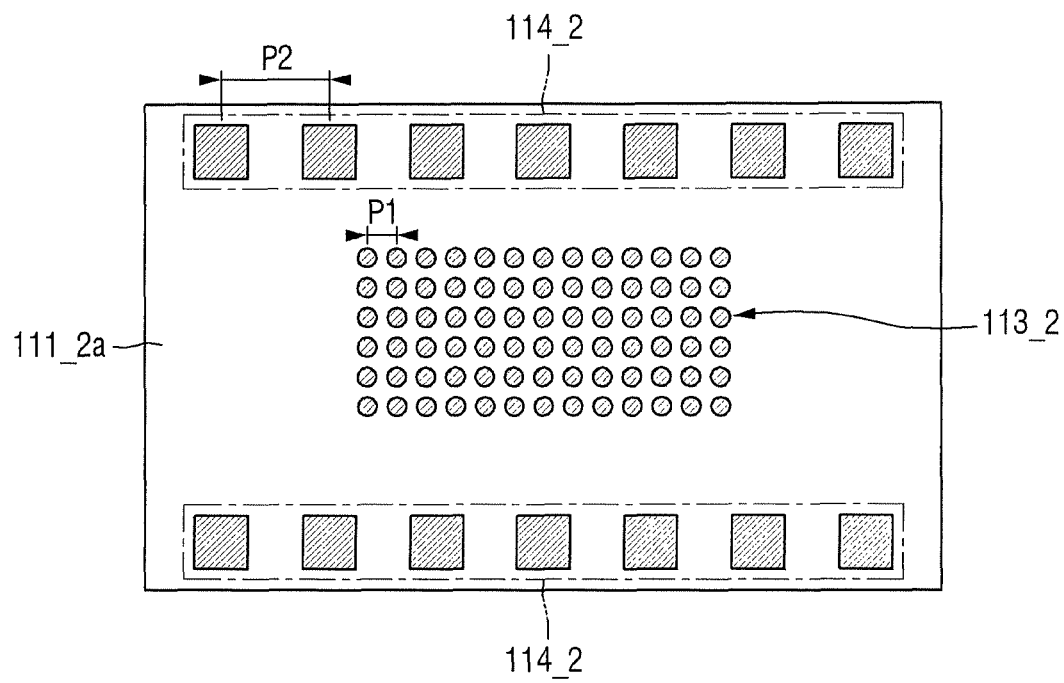
Figure 4:
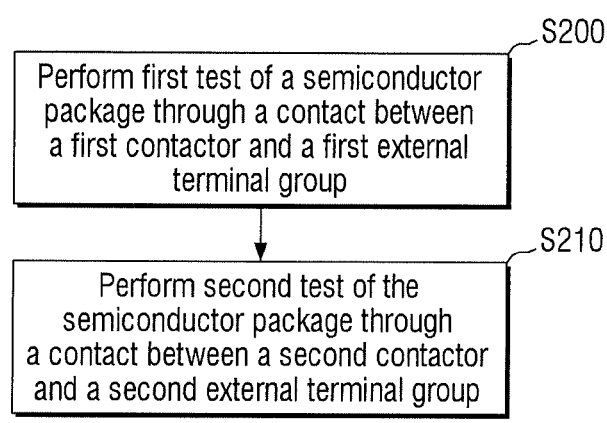
FIG. 4 is a flowchart provided to explain a method for testing a semiconductor package according to some exemplary embodiments.
Figure 6B:
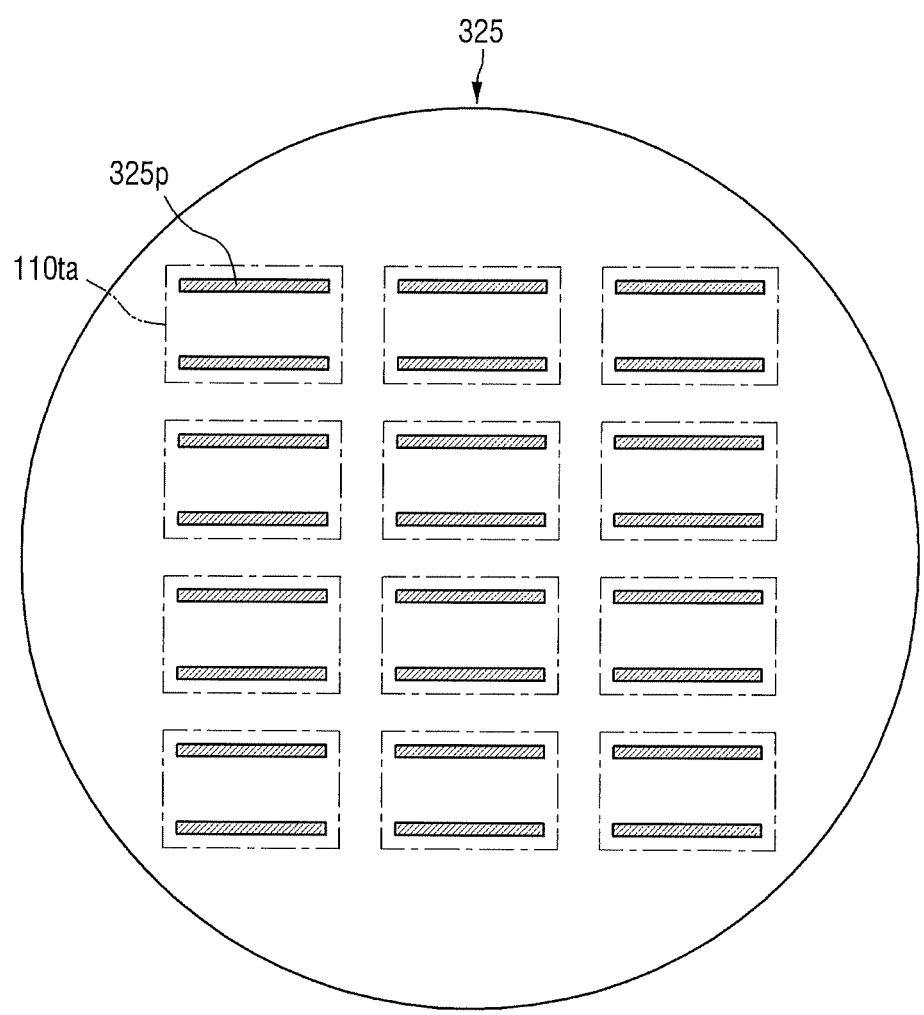

FIG. 1 is a view provided to explain semiconductor packages used in a method for testing a semiconductor package according to some exemplary embodiments. FIGS. 2A and 2B are cross sectional views provided to explain the semiconductor package of FIG. 1. FIGS. 3A and 3B are views provided to explain an external terminal group of the semiconductor package of FIG. 1. FIG. 4 is a flowchart provided to explain a method for testing a semiconductor package according to some exemplary embodiments. FIG. 5 is a provided to explain a test equipment of a semiconductor package used in a method for testing a semiconductor package according to some exemplary embodiments. FIGS. 6A and 6B are views provided to explain contactor module included in the semiconductor package test equipment of FIG. 5.

Referring to FIGS. 1 to 3B, a first semiconductor package group 100 attached to a carrier 50 may be provided.

The first semiconductor package group 100 may include a plurality of the semiconductor packages 110 which are separated from one another. That is, a plurality of the separated semiconductor packages 110 which are separated from one another may be attached to the carrier 50 and provided.

The carrier 50 may include a wafer ring 51 and an adhesive film 52. The adhesive film 52 may fix a plurality of the separated semiconductor packages 110 which are separated from one another to the wafer ring 51.

The adhesive film 52 may include, for example, a material which loses adhesive strength when exposed to irradiation of light.

For example, a plurality of the semiconductor packages 110 may include a first semiconductor package 110_1 and a second semiconductor package 110_2, which are separated from each other. That is, the first semiconductor package 110_1 and the second semiconductor package 110_2, which are attached to the carrier 50, may be provided.

A plurality of the semiconductor packages 110 may each include lower semiconductor chips 111_1, 111_2 and upper semiconductor chips 112_1, 112_2. Because a plurality of the semiconductor packages 110 may be respectively separated from one another, the lower semiconductor chips 111_1, 111_2 included in a plurality of the semiconductor packages 110 may be each separated from one another.

The lower semiconductor chips 111_1, 111_2 and the upper semiconductor chips 112_1, 112_2 may include, for example, a silicon substrate. Alternatively, the lower semiconductor chips 111_1, 111_2 and the upper semiconductor chips 112_1, 112_2 may include a different material, for example, silicon germanium, indium antimonide, lead telluride compound, indium arsenide, indium phosphide, gallium arsenide, or gallium antimonide.

The lower semiconductor chips 111_1, 111_2 may be, for example, logic chips. The lower semiconductor chips 111_1, 111_2 may be variously designed by considering the calculation performed, and so on.

The upper semiconductor chips 112_1, 112_2 may be, for example, memory chips. The upper semiconductor chips 112_1, 112_2 may be, for example, non-volatile memory chips or volatile memory chips.

Specifically, when a memory chip is a volatile memory chip, the memory chip may include a dynamic random-access memory (DRAM). When the memory chip is a non-volatile memory chip, the memory chip may be a flash memory chip. More specifically, the memory chip may be any one of NAND flash memory chip or NOR flash memory chip.

Meanwhile, the memory device according to the spirit of the present disclosure is not limited to the specific configuration exemplified above. According to some exemplary embodiments, the flash memory chip may include any one of a phase-change random-access memory (PRAM), a magneto-resistive random-access memory (MRAM), and a resistive random-access memory (RRAM).

The first semiconductor package 110_1 may include the first lower semiconductor chip 111_1, and one or more first upper semiconductor chips 112_1 which are stacked on the first lower semiconductor chip 111_1. The first lower semiconductor chip 111_1 may include a first surface 111_1a and a second surface 111_1b facing away from each other.

The first lower semiconductor chip 111_1 may include a first inner external terminal group 113_1 and a first outer external terminal group 114_1 which are arranged on the first surface 111_1a of the first lower semiconductor chip. The first outer external terminal group 114_1 and the first inner external terminal group 113_1 will be specifically explained below.

One or more first upper semiconductor chips 112_1 may be stacked on the second surface 111_1b of the first lower semiconductor chip. At least a portion of the first upper semiconductor chip 112_1 may include a first through electrode 115_1.

The first through electrode 115_1 may include, for example, copper (Cu), aluminum (Al), or tungsten (W). A liner and a barrier film may be additionally included between the first through electrode 115_1 and semiconductor material, which is a substrate of the first upper semiconductor chip 112_1. The barrier film may include, for example, Ta, TaN, Ti, TiN, Ru, Co, Ni, NiB, WN, and so on. The liner may include, for example, silicon oxide having a low dielectric constant, silicon oxide doping with carbon, and so on.

A first connection terminal 116_1 may be formed between the first lower semiconductor chip 111_1, the first upper semiconductor chip 112_1, and the adjacent first upper semiconductor chip 112_1. The first connection terminal 116_1 is illustrated in a ball shape, but not limited thereto. The first connection terminal 116_1 may be a pillar bump type combining pillars with solder balls.

A first molding material 118_1 may be formed on the second surface 111_1b of the first lower semiconductor chip. The first molding material 118_1 may surround the first upper semiconductor chip 112_1. The first molding material 118_1 may include, for example, epoxy resin or two or more types of silicon hybrid materials.

The second semiconductor package 110_2 may include the second lower semiconductor chip 111_2 and one or more second upper semiconductor chips 112_2 stacked on the second lower semiconductor chip 111_2. The second lower semiconductor chip 111_2 may include a first surface 111_2a and a second surface 111_2b facing away from each other.

The second lower semiconductor chip 111_2 may include a second inner external terminal group 113_2 and a second outer external terminal group 114_2 which are arranged on the first surface 111_2a of the second lower semiconductor chip. The second outer external terminal group 114_2 and the second inner external terminal group 113_2 will be specifically explained below.

One or more second upper semiconductor chips 112_2 may be stacked on the second surface 111_2b of the second lower semiconductor chip. At least a portion of the second upper semiconductor chip 112_2 may include a second through electrode 115_2.

The second connection terminal 116_2 may be formed between the second lower semiconductor chip 111_2, the second upper semiconductor chip 112_2, and the adjacent second upper semiconductor chip 112_2.

A second molding material 118_2 may be formed on the second surface 111_2b of the second lower semiconductor chip. The second molding material 118_2 may surround the second upper semiconductor chip 112_2.

Although FIGS. 2A and 2B illustrate that there are four first upper semiconductor chips 112_1 and the second upper semiconductor chips 112_2, it may not be limited hereto.

Further, FIGS. 2A and 2B illustrate that each of the first upper semiconductor chips 112_1 and each of the second upper semiconductor chips 112_2 include the through electrodes 115_1, 115-2, but not limited hereto. The first upper semiconductor chip 112_1 and the second upper semiconductor chip 112_2 which are positioned on the uppermost portion may not include the through electrodes 115_1, 115_2.

Additionally, the first molding material 118_1 and the second molding material 118_2 are illustrated not to cover respectively the upper surfaces of the first upper semiconductor chip 112_1 and the second upper semiconductor chip 112_2 which are positioned on the uppermost portion, but not limited hereto.

Furthermore, there are five through electrodes 115_1, 115_2 illustrated to be included in the first upper semiconductor chip 112_1 and the second upper semiconductor chip 112_2, but not limited hereto.

For reference, FIGS. 2A and 2B illustrate only the stack structure of the first semiconductor package 110_1 and the second semiconductor package 110_2. However, it is obvious to a person skilled in the art that each of the semiconductor packages 110 may include a same or similar structure to the first semiconductor package 110_1 and the second semiconductor package 110_2.

Referring to FIGS. 3A and 3B, the first inner external terminal group 113_1 and the first outer external terminal group 114_1 included in the first semiconductor package 110_1 and the second inner external terminal group 113_2 and the second outer external terminal group 114_2 included in the second semiconductor package 110_2 will be explained below.

The first inner external terminal group 113_1 may be arranged on the first surface 111_1a of the first lower semiconductor chip. The first inner external terminal group 113_1 may be positioned on a center of the first surface 111_1a of the first lower semiconductor chip.

The first inner external terminal group 113_1 may be arranged with a first pitch P1. The first pitch P1 may be, for example, less than about 100 μm.

The first outer external terminal group 114_1 may be arranged on the first surface 111_1a of the first lower semiconductor chip. The first outer external terminal group 114_1 may be positioned near an edge of the first surface 111_1a of the first lower semiconductor chip.

The first outer external terminal group 114_1 may be arranged with a second pitch P2. The first outer external terminal group 114_1 may be a design-for-test (DFT) based external terminal group.

The second inner external terminal group 113_2 may be arranged on the first surface 1112a of the second lower semiconductor chip. The second inner external terminal group 113_2 may be positioned about a center of the first surface 111_2a of the second lower semiconductor chip.

The second inner external terminal group 113_2 may be arranged with the first pitch P1.

The second outer external terminal group 114_2 may be arranged on the first surface 111_2a of the second lower semiconductor chip. The second outer external terminal group 114_2 may be positioned on an edge of the first surface 111_2a of the second lower semiconductor chip.

The second outer external terminal group 114_2 may be arranged with the second pitch P2. The second outer external terminal group 114_2 may be a DFT-based external terminal group based on DFT.

The first inner external terminal group 113_1 and the second inner external terminal group 113_2 may each include, for example, a micro bump array. Each of the micro bumps may be, for example, the pillar bump type combining pillars and solder balls, but not limited hereto.

FIGS. 3A and 3B illustrate that the first outer external terminal group 114_1 and the second outer external terminal group 114_2 may each be pad arrays, but not limited hereto. That is, the first outer external terminal group 114_1 and the second outer external terminal group 114_2 may also be, for example, a micro bump type or a solder ball type.

In the method for testing the semiconductor package according to some exemplary embodiments, the first pitch P1 of the adjacent inner external terminal groups 113_1, 113_2 may be less than the second pitch P2 of the adjacent outer external terminal groups 114_1, 114_2.

In the method for testing the semiconductor package according to some exemplary embodiments, a package test for the first semiconductor package 110_1 and the second semiconductor package 110_2 using the first and second inner external terminal groups 113_1, 113_2 may not be performed by using a socket.

In other words, the first pitch P1 should be large enough in order to allow a package test to be performed using the inner external terminal groups 113_1, 113_2 within each of the first semiconductor package 110_1 and the second semiconductor package 110_2 after the socket receives the first semiconductor package 110_1 and the second semiconductor package 110_2.

However, the first pitch P1 of the first inner external terminal group 113_1 included in the first semiconductor package 110_1 and the first pitch P1 of the second inner external terminal group 113_2 included in the second semiconductor package 110_2 may be very small. Accordingly, a package test using the first and second inner external terminal groups 113_1, 113_2 may not be performed by placing the first semiconductor package 110_1 and the second semiconductor package 110_2 in the socket.

Meanwhile, a package test of the first semiconductor package 110_1 using the first outer external terminal group 114_1 and a package test of the second semiconductor package 110_2 using the second outer external terminal group 114_2 may be performed by using the socket according to the pitches of the outer external terminal groups 114_1, 1142, or may not be performed.

This is because, according to a request of a manufacturer that manufactured the semiconductor package or a user of the semiconductor package, the second pitch P2 of the first outer external terminal group 114_1 and the first outer external terminal group 114_1 may vary.

In the method for testing the semiconductor package according to some exemplary embodiments, each of the semiconductor package 110 may not include a printed circuit board in which the inner external terminal groups 113_1, 113_2 and the outer external terminal groups 114_1, 114_2 are formed on one surface, as described above. That is, each of the semiconductor packages 110 may not be in a form in which a plurality of the semiconductor chips are mounted on the printed circuit board including the inner external terminal groups 113_1, 113_2 and the outer external terminal groups 114_1, 114_2.

Meanwhile, each of the semiconductor packages 110 may include the printed circuit board disposed between the lower semiconductor chip 111_1 and one or more upper semiconductor chips 112_1, 112_2.

In describing the method for testing the semiconductor package by referring to FIGS. 1 to 6B, it is explained that a package test of the first semiconductor package 110_1 using the first outer external terminal group 114_1 and a package test of the second semiconductor package 110_2 using the second outer external terminal group 114_2 are performed without using the socket.

For reference, FIGS. 3A and 3B illustrate only the structures of the first and second inner external terminal groups 113_1, 113_2 and the first and second outer external terminal groups 114_1, 114_2 of the first semiconductor package 110_1 and the second semiconductor package 110_2.

However, each of the semiconductor packages 110 includes the inner external terminal group and the outer external terminal group same as or similar to the first semiconductor package 110_1 and the second semiconductor package 110_2.

A process of forming the first semiconductor package group 100 of FIG. 1 will be briefly explained below.

A semiconductor substrate including a plurality of the lower semiconductor chips 111_1, 111_2 which are not separated from one another may be provided. At least one of the upper semiconductor chips 112_1, 112_2 may be stacked on each of the lower semiconductor chip.

Thereafter, a molding material surrounding the stacked body in which the upper semiconductor chips 112_1, 112_2 are stacked may be formed on the semiconductor substrate. Thereafter, the semiconductor substrate may be diced such that the lower semiconductor chips 111_1, 111_2 included in the semiconductor substrate are separated. A test of the lower semiconductor chips 111_1, 111_2 and the upper semiconductor chips 112_1, 112_2 may be performed at a wafer level before the dicing in order to examine whether the upper semiconductor chips 112_1, 112_2 are well mounted on the lower semiconductor chips 111_1, 111_2.

Because the first semiconductor package group 100 which are separated from one another through the dicing process is formed in FIG. 1, a width of separation between the adjacent semiconductor packages may be various. That is, a plurality of the semiconductor packages 110 may not be arranged at the same pitch.

Each of the semiconductor package 110 may be, for example, a high bandwidth memory (HBM), but not limited hereto.

The first semiconductor package test equipment 300 which can be used in the semiconductor package test described in FIG. 4 will be explained below by referring to FIG. 5.

Referring to FIGS. 5 to 6B, the first semiconductor package test equipment 300 may include a first tester 310, a second tester 320, a first contactor module 315, a second contactor module 325, a first examination stage 340, and a second examination stage 350.

The first semiconductor package test equipment 300 may include a first test region and a second test region. The first test region may be a region where the first tester 310 and the first contactor module 315 are arranged, and the second test region may be a region where the second tester 320 and the second contactor module 325 are arranged.

The first tester 310 may perform a first test of the semiconductor package (110 of FIG. 1). Further, the second tester 320 may perform a second test of the semiconductor package (110 of FIG. 1).

For example, a first test and a second test of the semiconductor package (110 of FIG. 1) may be performed by using the first semiconductor package test equipment 300 which may be a single piece of equipment.

A first test of the semiconductor package may include, for example, an open/short test, a leakage current test, an operation current test, a chip crack detection test, a gross functional test, and so on. Accordingly, the first test can be what is sometimes to referred to as a DC (Direct Current) test of the semiconductor package or circuits within the package.

A second test of the semiconductor package may be, for example, a functional test of the semiconductor package. Through the functional test, operation or failure of a whole region of a memory cell may be determined by applying a specific memory pattern to the semiconductor package for an operation test of the memory cell. Accordingly, the second test can be any test of the operations of the semiconductor package or circuits within the package. A pass/fail of the semiconductor package can be determined based the semiconductor package responses to predetermined data patterns that are applied over time (using, for example, a clock signal to operate the semiconductor package or circuits within the semiconductor package).

A second test may include, for example, a cell & core operation test, a speed test, a temperature test, and so on. The speed test may include a low frequency test, an intermediate frequency test, and a high frequency test, and the temperature test may include a low temperature test and a high temperature test.

For example, a first test may be a test taking several seconds to dozens of seconds, and a second test may be a test taking hundreds of seconds to thousands of seconds. Therefore, the time taken in a first test may be shorter than the time taken in a second test.

The first contactor module 315 may include a first contactor 315p used in a first test. The first contactor module 315 may be connected with the first tester 310.

FIG. 6A illustrates that the first contactor module 315 may include one first contactor 315p, but not limited hereto.

The first contactor module 315 may have one package test region 110ta defined therein corresponding to the first contactor 315p.

The first contactor 315p may be positioned within the package test region 110ta. The first contactor 315p may be positioned correspondingly to the inner external terminal groups 113_1, 113_2 of the semiconductor package 110.

The first contactor 315p may have a micro tip shape or a needle shape (i.e., micro test probes) for example, but not limited hereto.

Referring to FIG. 6B, the second contactor module 325 may include the second contactor 325p used in a second test. The second contactor module 325 may be connected with the second tester 320.

The second contactor module 325 may include a plurality of the second contactors 325p. The second contactor module 325 may have a plurality of the package test regions 110ta defined therein corresponding to the second contactor 325p.

Each of the second contactors 325p may be positioned within each of the package test regions 110ta. Each of the second contactors 325p may be positioned correspondingly to the outer external terminal groups 114_1, 114_2 of the semiconductor package.

The second contactor 325p may have, for example, a needle shape, but not limited hereto.

A second test using the second contactor module 325 may be simultaneously performed with respect to a plurality of the semiconductor packages.

The first contactor 315p may be arranged in the first test region of the first semiconductor package test equipment 300, and the second contactor 325p may be arranged in the second test region of the first semiconductor package test equipment 300.

The semiconductor package to perform a first test may be positioned on the first examination stage 340. The semiconductor package to perform a second test may be positioned on the second examination stage 350.

Referring to FIGS. 1, 4, and 5, the first semiconductor package group 100 attached to the carrier 50 may be loaded on the first semiconductor package test equipment 300.

A plurality of the semiconductor packages 110 may be provided for a test of each package included in the first semiconductor package group 100.

A plurality of the semiconductor packages attached to the carrier 50 may be arranged on the first examination stage 340. For example, the first semiconductor package 110_1 and the second semiconductor package 110_2 may be arranged on the first examination stage 340.

Referring to FIGS. 1 and 3A to 6a, a first test of the first semiconductor package 110_1 may be performed at S200, by contacting the first inner external terminal group 113_1 of the first semiconductor package 110_1 with the first contactor 315p.

The first tester 310 may perform a first test while contacting the first inner external terminal group 113_1 with the first contactor 315p.

Because the first inner external terminal group 113_1 may include the micro bump array, a first test of the first semiconductor package 110_1 may be performed through the contact between the micro bump array (or micro bump group) and the first contactor 315p.

The first inner external terminal group 113_1 and the first contactor 315p may be aligned and contacted as the first examination stage 340 performs a rotating movement, a horizontal movement, or a vertical movement.

The first semiconductor package 110_1 finished with a first test may be moved to the second examination stage 350 by a first transport 330.

Thereafter, a first test of the second semiconductor package 110_2 may be performed by contacting the second inner external terminal group 113_2 of the second semiconductor package 110_2 with the first contactor 315p.

The first tester 310 may perform a first test while contacting the second inner external terminal group 113_2 with the first contactor 315p.

The second inner external terminal group 113_2 and the first contactor 315p may be aligned and contacted as the first examination stage 340 performs the rotating movement, the horizontal movement or the vertical movement.

A first test of the first semiconductor package 110_1 may be performed at a separate process from a first test of the second semiconductor package 110_2. In other words, a first test of the second semiconductor package 110_2 may be performed by having a time difference with a first test of the first semiconductor package 110_1.

Because a first test is performed by using the first and second inner external terminal groups 113_1, 113_2, a first test may be performed without the socket receiving each of the first and second semiconductor packages 110_1, 110_2. That is, a first test may be a package test which does not use the socket.

A first test of each of the semiconductor packages may be performed by contacting the inner external terminal groups included in each of the semiconductor packages 110 with the first contactor 315p. When the micro bump group is included as an inner external terminal group, a first test of each of the semiconductor packages may be performed by contacting the micro bump group included in each of the semiconductor packages (110 of FIG. 1) with the first contactor 315p.

For example, a first test may be performed with respect to one semiconductor package 110.

Each of the semiconductor packages 110 finished with the first test may be moved to the second examination stage 350 by the first transport 330.

In the method for testing the semiconductor package described by referring to FIG. 5, a first test may be performed while the first semiconductor package group 100 is being attached to the carrier 50.

Referring to FIGS. 5 and 6b, the first semiconductor package 110_1 and the second semiconductor package 110_2 finished with the first test may be re-arranged on the second examination stage 350.

That is, at least a portion of the first semiconductor package group 100 finished with the first test may be re-arranged on the second examination stage 350.

In other words, at least a portion of a plurality of the semiconductor packages (110 of FIG. 1) provided to the carrier 50 may be re-arranged on the second examination stage 350. At least a portion of a plurality of the semiconductor packages (110 of FIG. 1) re-arranged on the second examination stage 350 may be the packages finished with the first test.

The second semiconductor package group 101 may be provided on the second examination stage 350 by re-arranging at least a portion of a plurality of the semiconductor packages 110 respectively on the second examination stage 350.

The second semiconductor package group 101 on the second examination stage 350 may be positioned correspondingly to the second contactor 325p included in the second contactor module 325.

That is, by re-arranging at least a portion of a plurality of the semiconductor packages finished with the first test on the second examination stage 350, each of the semiconductor packages (110 of FIG. 1) finished with the first test is positioned correspondingly to the second contactor 325p.

The second semiconductor package group 101 provided on the second examination stage 350 may include the first semiconductor package 110_1 and the second semiconductor package 110_2 that finished with the first test at separate processes from each other. That is, the second semiconductor package group 101 may include at least two semiconductor packages 110.

The second semiconductor package group 101 provided on the second examination stage 350 may be moved to under the second contactor module 325 connected with the second tester 320. The second examination stage 350 may be moved to under the second contactor module 325 by a second transport 360. It will be understood that, in some embodiments, the first and second testers 310 and 320 can be enclosed or integrated into a single test chamber Referring to FIGS. 1 and 3A to 6b, a second test of the first semiconductor package 110_1 and a second test of the second semiconductor package 110_2 may be simultaneously performed at S210 by contacting the first outer external terminal group 114_1 of the first semiconductor package 110_1 with the second contactor 325p and contacting the second outer external terminal group 114_2 of the second semiconductor package 110_2 with the second contactor 325p.

The second tester 320 may perform a second test while the first outer external terminal group 114_1 is being contacted with the second contactor 325p and the second outer external terminal group 114_2 is being contacted with the second contactor 325p.

Because the first outer external terminal group 114_1 and the second outer external terminal group 114_2 may each include the pad array, a second test of the first semiconductor package 110_1 and a second test of the second semiconductor package 110_2 may be simultaneously performed through the contact between the pad array (or pad group) and the second contactor 325p.

In the method for testing the semiconductor package described by referring to FIG. 5, a second test may be performed without the socket receiving each of the first and second semiconductor packages 110_1, 110_2. That is, a second test may be a package test which does not use the socket.

A second test of the semiconductor package 110 included in the second semiconductor package group 101 may be performed by contacting the outer external terminal group of each of the semiconductor package 110 included in the second semiconductor package group 101 with the second contactor 325p.

A second test may be simultaneously performed with respect to the semiconductor package 110 included in the second semiconductor package group 101.

Although not illustrated in FIG. 5, the semiconductor package 110 included in the second semiconductor package group 101 finished with the second test may be classified. For example, the semiconductor packages which passed the first test and the second test and semiconductor package which did not pass the test may be divided and put in a tray.

Effects that can be obtained through the method for testing the semiconductor package of the present disclosure will be explained below.

For example, it is assumed that the time taken for performing a first test is 10 seconds and the time taken for performing a second test is 1000 seconds. Accordingly, the difference in the first and second test times can be at least two orders of magnitude.

When a first test and a second test of one semiconductor package are sequentially processed, the time requested for testing one semiconductor package may be 1010 seconds. About hundred thousand seconds may be necessary in order to test a hundred semiconductor packages.

However, when a second test is performed with respect to a hundred semiconductor packages, about two thousand seconds may be only needed in order to test a hundred semiconductor packages.

That is, the productivity of a package test can be enhanced by simultaneously performing a second test that uses much time with respect to a plurality of the semiconductor packages.

FIG. 5 illustrates that there is one second examination stage 350, but not limited hereto.

When there are two second examination stages, the semiconductor packages finished with the first test may be re-arranged on the other examination stage while a second test is being performed for the second semiconductor package group 101 re-arranged on the one examination stage. Through the above process, the test efficiency of the semiconductor package can be enhanced.

FIG. 7 is a provided to explain a semiconductor package test equipment used in a method for testing a semiconductor package according to some exemplary embodiments. For convenience of explanation, differences that are not explained above with reference to FIGS. 1 to 6B will be mainly explained below.

Referring to FIG. 7, the carrier 50 attached with the first semiconductor package group 100 may be loaded on a first support table 370.

One semiconductor package 110 among the first semiconductor package group 100 placed on the first support table 370 may be separated from the carrier 50.

The separated semiconductor package 110 may be moved to the first examination stage 340 by the first transport 330.

In the method for testing the semiconductor package described by referring to FIG. 7, a first test may be performed while the first semiconductor package group 100 is being separated from the carrier 50.

Because the first test is performed after the first semiconductor package group 100 is separated from the carrier 50, defects that can be generated during a process of separating the semiconductor package 110 may be examined through the first test. Further, a low temperature test or a high temperature test may be performed.

FIG. 7 illustrates that a first test is performed with respect to one semiconductor package 110, but not limited hereto.

A first test may be performed with respect to a plurality of the semiconductor packages 110 re-arranged after a plurality of the semiconductor packages 110 are moved to the first examination stage 340 by the first transport 330. In this case, the first contactor module 315 described in FIG. 6A may include a plurality of the first contactors 315p.

However, because the first test uses the inner external terminal groups (113_1, 113_2 of FIGS. 3A and 3B) having a small pitch and including many the inner external terminals, alignment between the first contactor 315p and the inner external terminal groups 113_1, 113_2 may be difficult. Therefore, when a first test is performed with respect to a plurality of the semiconductor packages 110, the first test may be simultaneously performed with respect to about two to four semiconductor packages 110.

Figure 8:
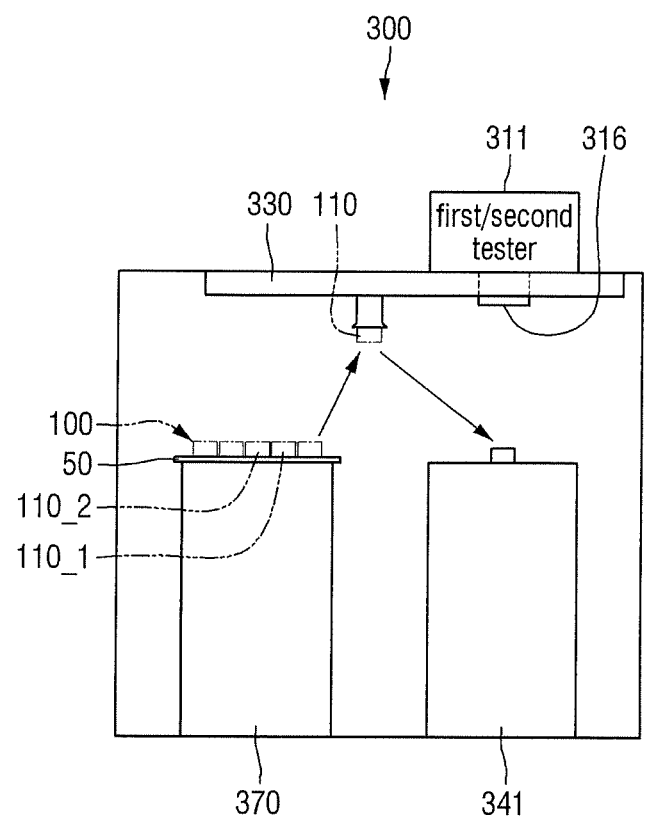
FIG. 8 is a view provided to explain semiconductor package test equipment used in a method of testing semiconductor packages according to some exemplary embodiments.
Figure 9A:
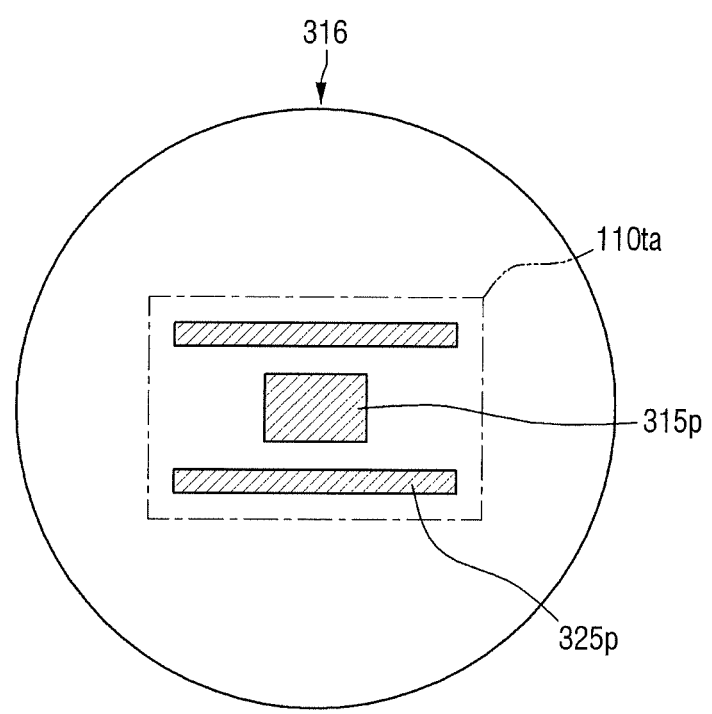
FIGS. 9A and 9B are views provided to explain a hybrid contactor module included in the semiconductor package test equipment of FIG. 8.
Figure 9B:
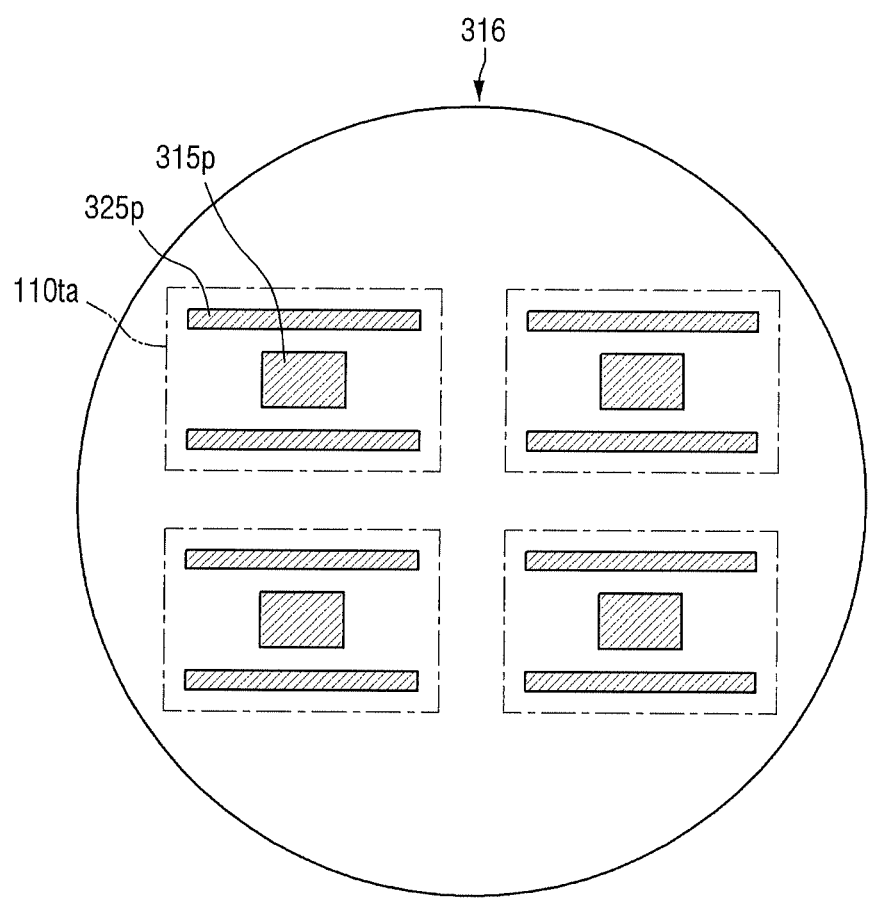

FIG. 8 is a view provided to explain a semiconductor package test equipment used in a method for testing a semiconductor package according to some exemplary embodiments. FIGS. 9A and 9B are views provided to explain a hybrid contactor module included in the semiconductor package test equipment of FIG. 8. For convenience of explanation, differences that are not explained above with reference to FIG. 7 will be mainly explained below.

Referring to FIGS. 8 to 9B, the first semiconductor package test equipment 300 may include the hybrid contactor module 316 and a hybrid tester 311.

The hybrid contactor module 316 may be connected with the hybrid tester 311.

The hybrid contactor module 316 may include the first contactor 315p used in a first test and the second contactor 325p used in a second test.

In the hybrid contactor module 316, the first contactor 315p and the second contactor 325p may be positioned within the package test region 110ta.

The first contactor 315p of the hybrid contactor module 316 may be used for a first test.

The second contactor 325p of the hybrid contactor module 316 may be used for a second test.

The hybrid tester 311 may simultaneously perform a first test and a second test of the semiconductor package 110. The hybrid tester 311 may include the first tester for performing a first test and the second tester for performing a second test.

Meanwhile, according to need, the hybrid tester 311 may perform a first test of the semiconductor package 110 only, or perform a second test of the semiconductor package only.

One semiconductor package 110 among the first semiconductor package group 100 placed on the first support table 370 may be separated from the carrier 50. The separated semiconductor package 110 may be moved to the first examination stage 341 by the first transport 330.

A first test and a second test may be simultaneously performed by contacting the inner external terminal group and the outer external terminal group which are included in the semiconductor package 110 on the first examination stage 341 with the first contactor 315p and the second contactor 325p.

FIG. 9A illustrates the hybrid contactor module 316 including each one of the first contactor 315*p* and the second contactor 325*p*, and FIG. 9B illustrates the hybrid contactor module 316 including a plurality of the first contactors 315*p* and the second contactors 325*p*.

Figure 10:
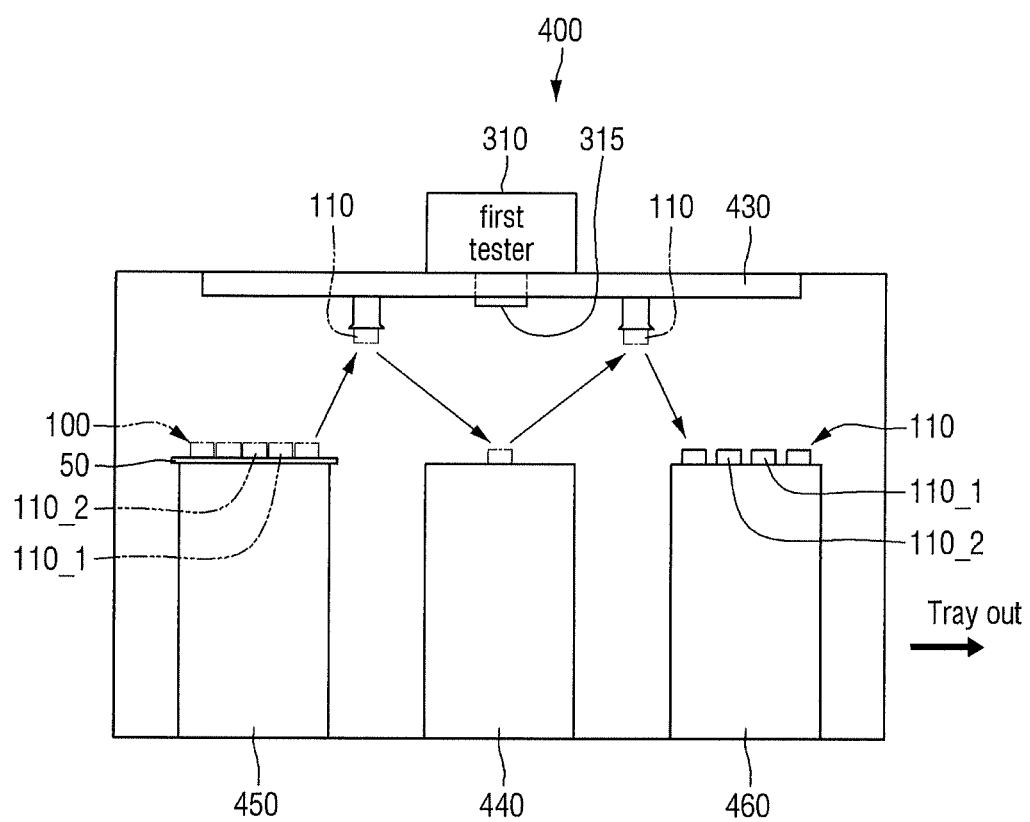
FIG. 10 is a view provided to explain semiconductor package test equipment used in a first test of a method of testing semiconductor packages according to some exemplary embodiments.
Figure 11:
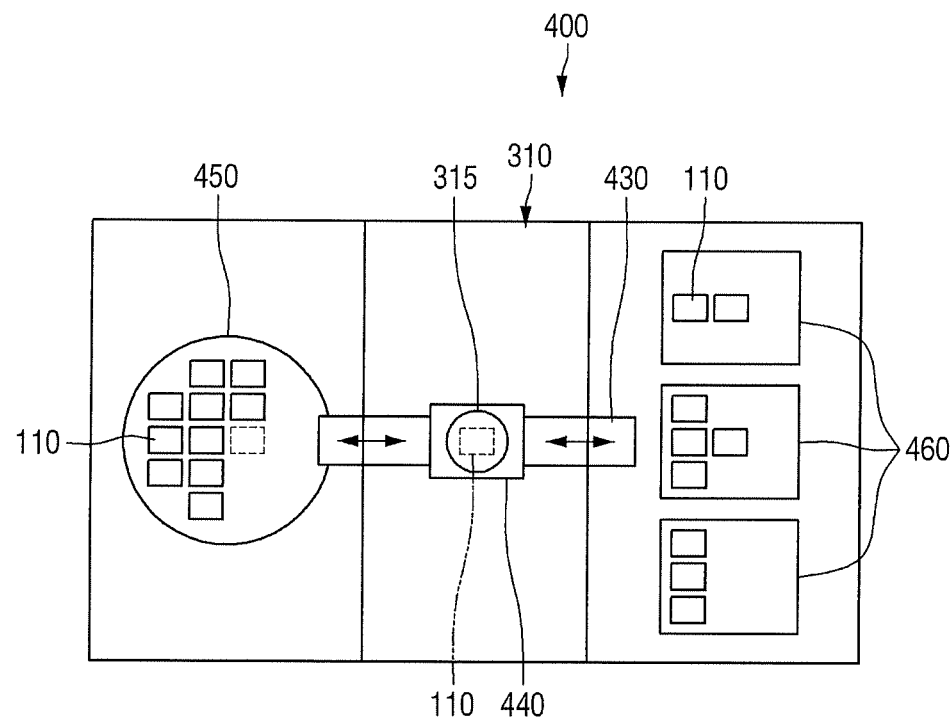
FIG. 11 is a layout view of FIG. 10.
Figure 12:
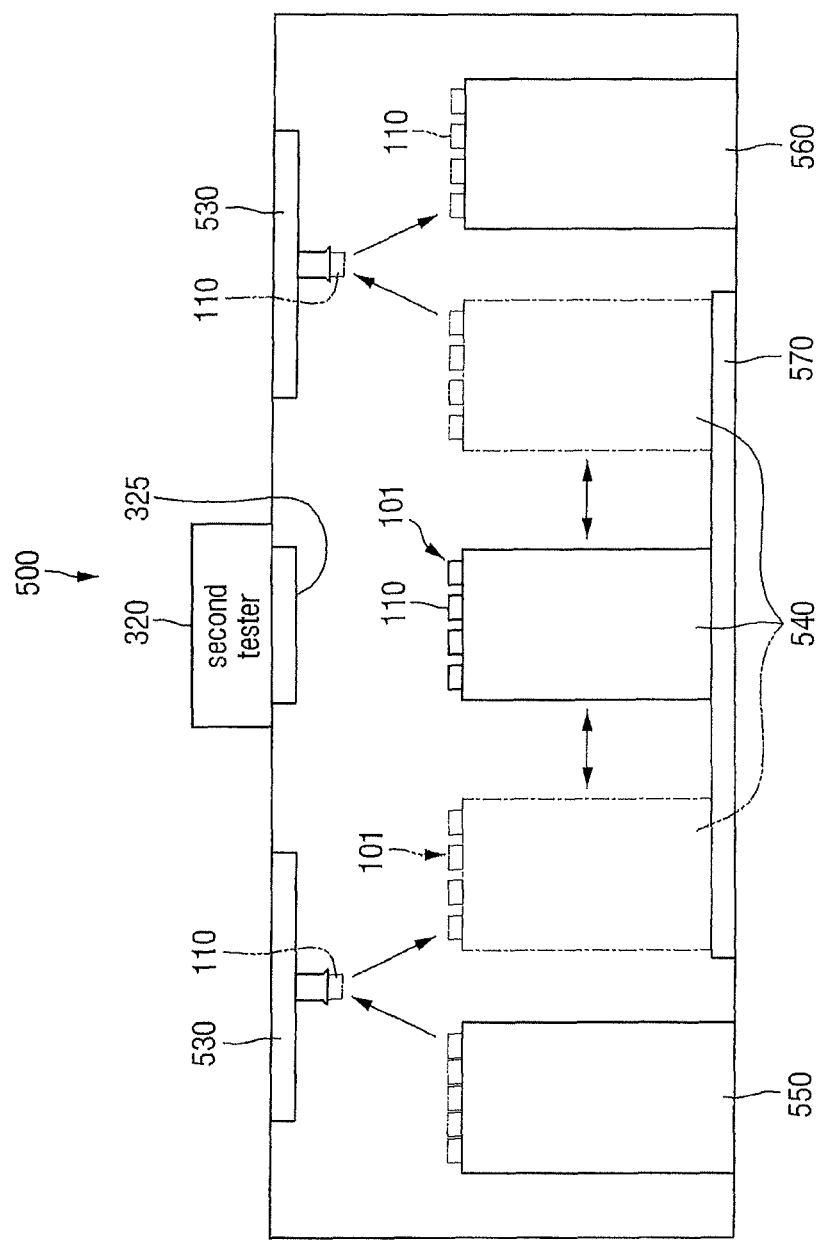
FIG. 12 is a view provided to explain semiconductor package test equipment used in a second test of a method of testing a semiconductor package according to some exemplary embodiments.
Figure 13:
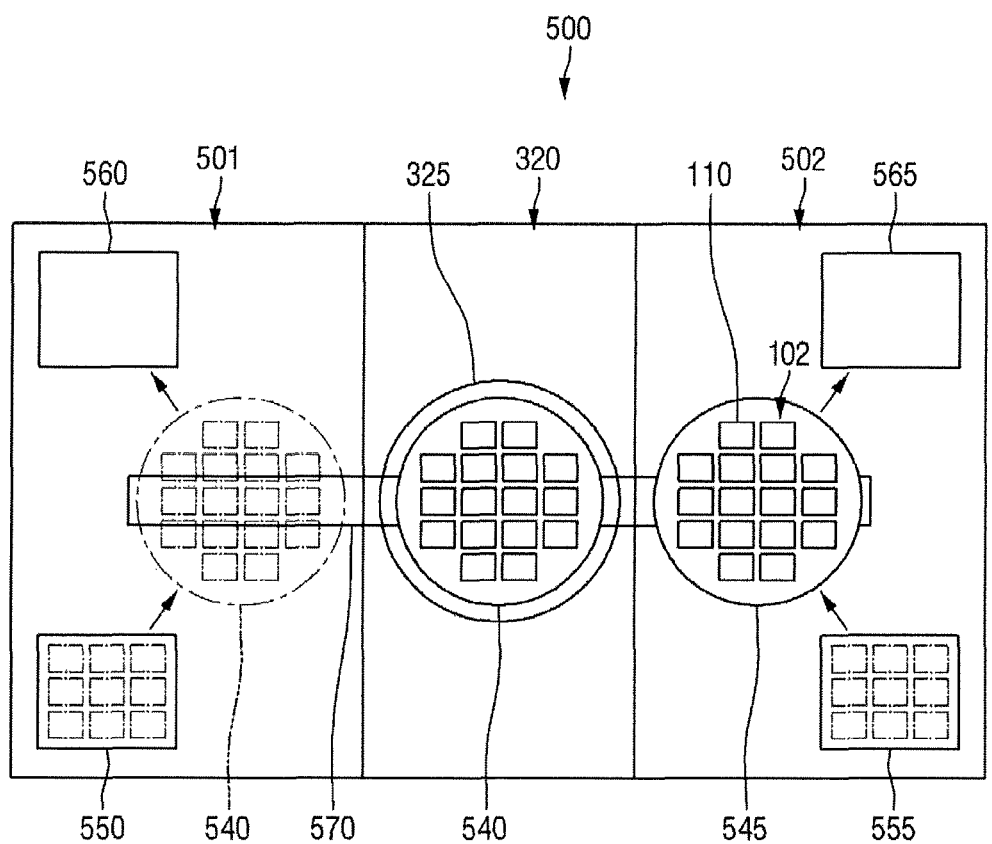
FIG. 13 is a layout view of FIG. 12.

FIG. 10 is a provided to explain a semiconductor package test equipment used in a first test of a method for testing a semiconductor package according to some exemplary embodiments. FIG. 11 is a layout view of FIG. 10. FIG. 12 is a provided to explain a semiconductor package test equipment used in a second test of a method for testing a semiconductor package according to some exemplary embodiments. FIG. 13 is a layout view of FIG. 12.

Referring to FIGS. 10 and 11, the second semiconductor package test equipment 400 may include the first tester 310, the first contactor module 315, a third examination stage 440, and a first discharge tray 460.

The third examination stage 440 may be a place where the semiconductor package 110 to undergo a first test is positioned.

The first discharge tray 460 may be a region where the first semiconductor package group 100 finished with the first test is classified and put in.

Referring to FIGS. 12 and 13, the third semiconductor package test equipment 500 may include the second tester 320, a fourth examination stage 540, a fifth examination stage 545, a first loading tray 550, a second loading tray 555, a second discharge tray 560, and a third discharge tray 565.

The third semiconductor package test equipment 500 may include a first loading region 501, a second loading region 502, and a test region. The first loading region 501 may include the fourth examination stage 540, the first loading tray 550, and the second discharge tray 560. The second loading region 502 may include the fifth examination stage 545, the first loading tray 550, and the second discharge tray 560. The test region may include the second tester 320.

The first loading tray 550 and the second loading tray 555 may be the first discharge tray 460 moved out of the second semiconductor package test equipment 400 or a region for receiving the semiconductor package in the first discharge tray 460, respectively.

Referring to FIGS. 10 and 11, one semiconductor package 110 among the first semiconductor package group 100 placed on a second support table 450 may be separated from the carrier 50. The separated semiconductor package 110 may be moved to the third examination stage 440 by a third transport 430.

A first test may be performed with respect to the semiconductor package 110 placed on the third examination stage 440. The semiconductor package 110 placed on the third examination stage 440 may be moved to the first discharge tray 460 and classified according to a first test result.

Among a plurality of the semiconductor packages 110 included in the first semiconductor package group 100, the semiconductor packages determined to be acceptable in a first test may be put into a portion of the first discharge tray 460.

That is, at least a portion of a plurality of the semiconductor packages 110 fed into the second semiconductor package test equipment 400 may be determined to be acceptable, and the semiconductor packages 110 determined to be acceptable may be discharged (tray-out) from the second semiconductor package test equipment 400 through the first discharge tray 460.

For convenience of explanation, it is explained that the first semiconductor package 110_1 and the second semiconductor package 110_2 are determined to be acceptable in a first test.

Referring to FIGS. 12 and 13, the semiconductor packages 110 determined to be acceptable and discharged from the second semiconductor package test equipment 400 through the first discharge tray 460 may be in the first loading tray 550.

The first semiconductor package 110_1 and the second semiconductor package 110_2 may be in the first loading tray 550.

A plurality of the semiconductor packages 110 in the first loading tray 550 may be re-arranged on the fourth examination stage 540 by using a fourth transport 530. Through the above process, the second semiconductor package group 101 may be provided on the fourth examination stage 540.

The second semiconductor package group 101 provided on the fourth examination stage 540 may be moved to under the second contactor module 325 within the test region, by a fifth transport 570. Thereafter, a second test may be performed with respect to the semiconductor package 110 included in the second semiconductor package group 101.

While a second test is being performed with respect to the second semiconductor package group 101, a third semiconductor package group 102 may be provided on the fifth examination stage 545 within the second loading region 502.

More specifically, the semiconductor package 110 determined to be acceptable and discharged from the second semiconductor package test equipment 400 through the first discharge tray 460 may be in the second loading tray 555.

A plurality of the semiconductor packages 110 in the second loading tray 555 may be re-arranged on the fifth examination stage 545 by using the fourth transport 530. Through the above process, the third semiconductor package group 102 may be provided on the fifth examination stage 545.

The second semiconductor package group 101 finished with the second test may be classified and put into the second discharge tray 560.

Likewise, the third semiconductor package group 102 finished with the second test may be classified and put into the third discharge tray 565.

In the method for testing the semiconductor package described by referring to FIGS. 10 to 13 according to exemplary embodiments, a first test may be performed within the second semiconductor package test equipment 400, and a second test may be performed within the third semiconductor package test equipment 500 using the semiconductor package 110 discharged from the second semiconductor package test equipment 400.

Figure 14:
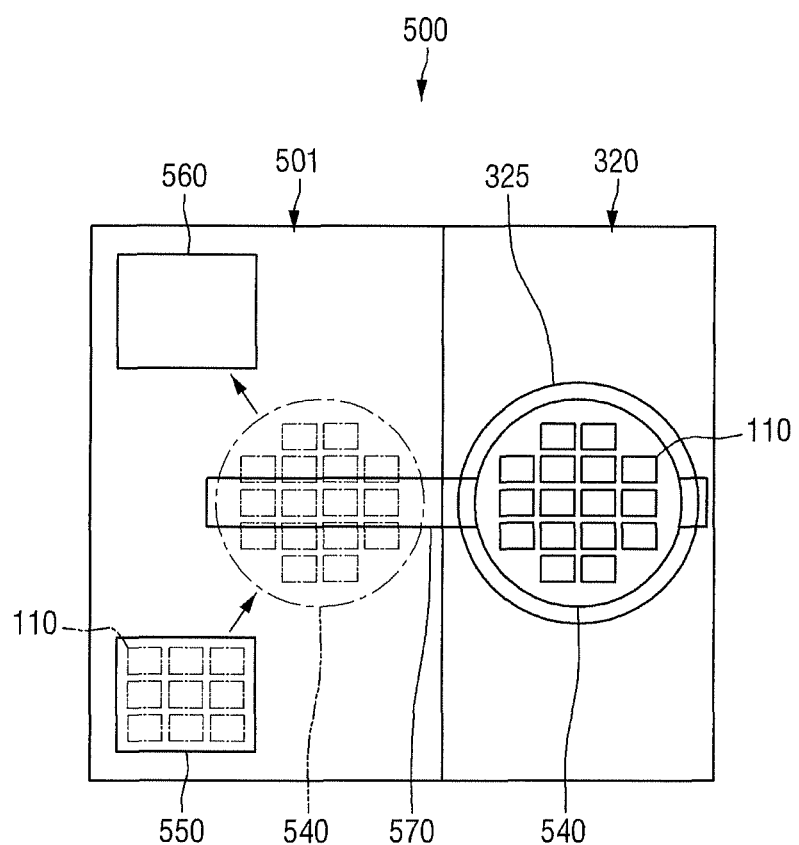
FIG. 14 is a layout view of a semiconductor package test equipment used in a second test of a method of testing semiconductor packages according to some exemplary embodiments.

FIG. 14 is a layout view of a semiconductor package test equipment used in a second test of a method for testing a semiconductor package according to some exemplary embodiments. For convenience of explanation, differences that are not explained above with reference to FIGS. 10 to 13 will be mainly explained below.

Referring to FIG. 14, the third semiconductor package test equipment 500 may include the second tester 320, the fourth examination stage 540, the first loading tray 550, and the second discharge tray 560.

That is, the third semiconductor package test equipment 500 may include one loading region 501 and the test region including the second tester 320.

Figure 15:
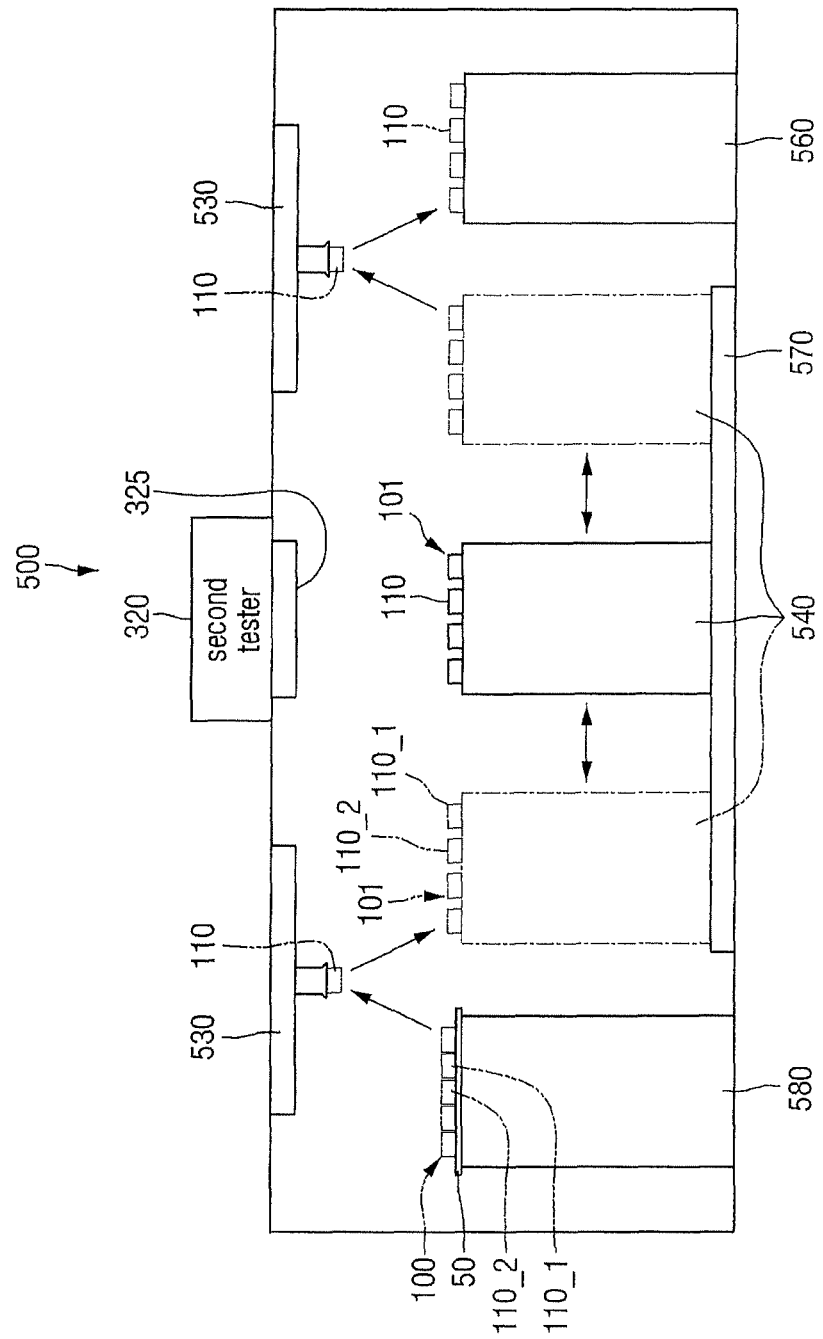
FIG. 15 is a layout view of a semiconductor package test equipment used in a second test of a method for testing semiconductor packages according to some exemplary embodiments.

FIG. 15 is a layout view of a semiconductor package test equipment used in a second test of a method for testing a semiconductor package according to some exemplary embodiments. For convenience of explanation, differences that are not explained above with reference to FIGS. 12 to 13 will be mainly explained below.

Referring to FIG. 15, the carrier 50 attached with the first semiconductor package group 100 may be loaded on a third support table 580.

Each of a plurality of the semiconductor packages 110 placed on the third support table 580 may be separated from the carrier 50, and moved sequentially onto the fourth examination stage 540.

The semiconductor package 110 moved onto the fourth examination stage 540 may be re-arranged on the fourth examination stage 540. For example, the first semiconductor package 110_1 and the second semiconductor package 110_2 may be re-arranged on the fourth examination stage 540.

Through the above process, the second semiconductor package group 101 may be provided on the fourth examination stage 540.

A second test may be performed with respect to the second semiconductor package group 101 provided on the fourth examination stage 540.

The semiconductor package test method described by referring to FIG. 15 may apply to a case in which a first test is not performed, i.e., only a second test is performed.

Because a second test is performed after the first semiconductor package group 100 is separated from the carrier 50, defects that can be generated during a process of separating the semiconductor package 110 may be examined through a second test.

Figure 16:
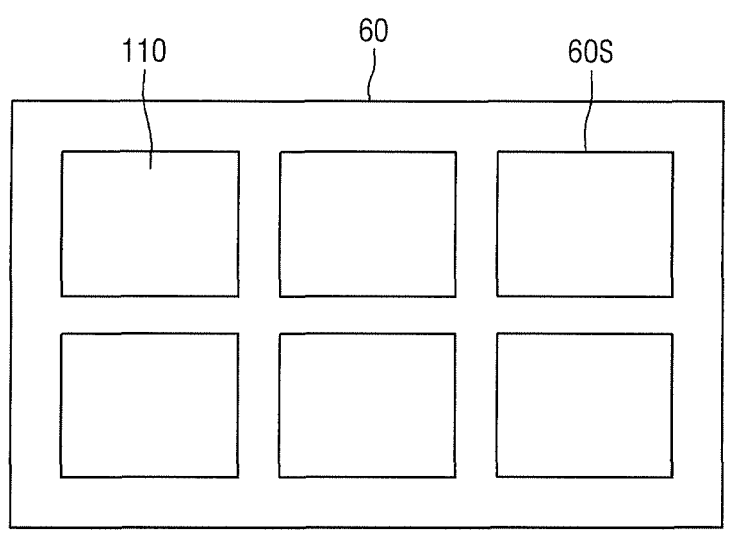
FIG. 16 is a view provided to explain a socket that can be used in a second test of a method for testing semiconductor packages according to some exemplary embodiments.

FIG. 16 is a provided to explain a socket that can be used in a second test of a method for testing a semiconductor package according to some exemplary embodiments.

Referring to FIG. 16, a plurality of the semiconductor packages 110 may receive a package seating portion 60s of the socket 60, respectively.

A second test may be performed by using the socket including a plurality of the semiconductor packages 110.

In the semiconductor package described by referring to FIG. 16, the outer external terminal groups (114_1, 114_2 of FIGS. 3A and 3B) may be arranged by a second pitch P2 which is large enough to allow a second test to be performed by using the socket.

Further, the second test performed by using the socket may include constitution that is different from the semiconductor package test equipment described by referring to FIGS. 1 to 15.

In concluding the detailed description, those skilled in the art will appreciate that many variations and modifications can be made to the preferred embodiments without substantially departing from the principles of the present inventive concept. Therefore, the disclosed preferred embodiments of the invention are used in a generic and descriptive sense only and not for purposes of limitation.

What is claimed is:

1. A semiconductor integrated circuit test system comprising:
   a first semiconductor integrated circuit tester configured to conduct a first test of a first characteristic of a first semiconductor integrated circuit of a plurality of semiconductor integrated circuits, wherein the first test is completed by the first semiconductor integrated circuit tester within a first test time wherein the first semiconductor integrated circuit tester further comprises a first test contactor including a plurality of micro test probes configured to contact first test pads, spaced apart at a first pitch, of the first semiconductor integrated circuit;
   a second semiconductor integrated circuit tester, coupled to the first semiconductor integrated circuit tester, the second semiconductor integrated circuit tester configured to conduct a second test of a second characteristic of each of the plurality of the semiconductor integrated circuits simultaneously, wherein the second test is completed within a second test time that is at least two orders of magnitude more than the first test time and wherein the second semiconductor integrated circuit tester further comprises a second test contactor including a plurality of test probes configured to contact second test pads, spaced apart at a second pitch that is greater than the first pitch, of the first semiconductor integrated circuit;
   a first examination stage configured to provide the plurality of semiconductor integrated circuits at a first spacing for contact by the plurality of micro test probes at the first pitch for the first test;
   a second examination stage configured to provide the plurality of semiconductor integrated circuits at a second spacing for contact by the plurality of test probes at the second pitch for the second test;
   a first transport apparatus configured to serially move each of the plurality of semiconductor integrated circuits from the first examination stage to the second examination stage at a second examination stage loading position, responsive to completion of the first test on each of the plurality of semiconductor integrated circuits; and
   a second transport apparatus configured to move the second examination stage, loaded with the plurality of semiconductor integrated circuits at the second spacing, from the second examination stage loading position to a second examination stage testing position for the second test.

2. The system of claim 1 wherein the first test comprises a DC characteristic test and the second test comprises a functional characteristic test.

3. The system of claim 2 wherein the DC characteristic test determines passage or failure based on measured current and/or voltage values and the functional characteristic test determines passage or failure based on predetermined data patterns.

4. The system of claim 1 wherein the first test time is less than or equal to about 10 seconds and the second test time is equal to or greater than about 1000 seconds.

5. The system of claim 1 wherein the first pitch is about 55 um and the second pitch is about 180 um.

6. The system of claim 1 wherein the first and second semiconductor integrated circuit testers are integrated into a single chamber.

7. The system of claim 1 wherein the first and second semiconductor integrated circuit testers are separated into a first chamber and a second chamber, respectively.

8. A semiconductor integrated circuit test system comprising:
   a first semiconductor integrated circuit tester configured to conduct a first test of a first characteristic of a first semiconductor integrated circuit of a plurality of semiconductor integrated circuits, wherein the first test is completed by the first semiconductor integrated circuit tester within a first test time wherein the first semiconductor integrated circuit tester further comprises a first test contactor including a plurality of micro test probes configured to contact first test pads, spaced apart at a first pitch, of the first semiconductor integrated circuit;

a second semiconductor integrated circuit tester, coupled to the first semiconductor integrated circuit tester, the second semiconductor integrated circuit tester configured to conduct a second test of a second characteristic of each of the plurality of the semiconductor integrated circuits simultaneously, wherein the second test is completed within a second test time that is at least two orders of magnitude more than the first test time and wherein the second semiconductor integrated circuit tester further comprises a second test contactor including a plurality of test probes configured to contact second test pads, spaced apart at a second pitch that is greater than the first pitch, of the first semiconductor integrated circuit;

a table configured to support the plurality of semiconductor integrated circuits at a first spacing;

a first examination stage configured to provide a selected one of the plurality of semiconductor integrated circuits for contact by the plurality of micro test probes at the first pitch for the first test;

a second examination stage configured to provide the plurality of semiconductor integrated circuits at a second spacing for contact by the plurality of test probes at the second pitch for the second test;

a first transport apparatus configured to move the selected one of the plurality of semiconductor integrated circuits from the table to the first examination stage at a first examination stage loading position;

a second transport apparatus configured to move the first examination stage, having the selected one of the plurality of semiconductor integrated circuits thereon, from the first examination stage loading position to a first examination stage testing position for the first test;

a third transport apparatus configured to move selected ones of the plurality of semiconductor integrated circuits from the first examination stage in the first examination stage loading position to the second examination stage at a second examination stage loading position at the second pitch, responsive to completion of the first test on each of the plurality of semiconductor integrated circuits; and a fourth transport apparatus configured to move the second examination stage, loaded with the plurality of semiconductor integrated circuits at the second spacing, from the second examination stage loading position to a second examination stage testing position for the second test.

9. The system of claim 1 wherein the plurality of semiconductor integrated circuits comprises a plurality of high bandwidth memory devices.

* * * * *

UNITED STATES PATENT AND TRADEMARK OFFICE
CERTIFICATE OF CORRECTION

PATENT NO. : 10,444,270 B2  
APPLICATION NO. : 15/455818  
DATED : October 15, 2019  
INVENTOR(S) : Ji Nyeong Yun et al.

Page 1 of 1

It is certified that error appears in the above-identified patent and that said Letters Patent is hereby corrected as shown below:

In the Specification

Column 6, Lines 41-42: Replace "and the first outer exterminal terminal group 114_1"  
With --and the second outer external group 114_2--.

Column 6, Lines 44-45: Replace "each of the semiconductor package 110"  
With --each of the semiconductor packages 110--.

Column 11, Line 33: Replace "About hundred thousand seconds"  
With --About a hundred thousand seconds--.

Column 11, Line 52: Replace "FIG. 7 is a provided to"  
With --FIG. 7 is provided to--.

Column 13, Line 6: Replace "FIG. 10 is a provided to"  
With --FIG. 10 is provided to--.

Column 13, Lines 9-10: Replace "FIG. 12 is a provided to"  
With --FIG. 12 is provided to--.

Signed and Sealed this  
Thirty-first Day of December, 2019

Andrei Iancu  
*Director of the United States Patent and Trademark Office*